(12) United States Patent
Su et al.

(10) Patent No.: US 11,087,978 B2
(45) Date of Patent: Aug. 10, 2021

(54) OXIDE SEMICONDUCTOR LAYER AND PREPARATION METHOD THEREOF, DEVICE, SUBSTRATE AND MEANS

(71) Applicants: Hefei Xinsheng Optoelectronics Technology Co., Ltd., Anhui (CN); BOE Technology Group Co., Ltd., Beijing (CN)

(72) Inventors: Tongshang Su, Beijing (CN); Dongfang Wang, Beijing (CN); Jun Liu, Beijing (CN); Qinghe Wang, Beijing (CN); Wuxia Fu, Beijing (CN); Liangchen Yan, Beijing (CN); Guangcai Yuan, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/509,542

(22) Filed: Jul. 12, 2019

(65) Prior Publication Data
US 2020/0027729 A1   Jan. 23, 2020

(30) Foreign Application Priority Data
Jul. 19, 2018 (CN) .......................... 201810796404.4

(51) Int. Cl.
*H01L 21/02* (2006.01)
*C23C 16/40* (2006.01)
(Continued)

(52) U.S. Cl.
CPC ...... *H01L 21/02565* (2013.01); *C23C 16/407* (2013.01); *C23C 16/56* (2013.01);
(Continued)

(58) Field of Classification Search
CPC .......... H01L 21/02565; H01L 29/7869; H01L 29/78696; H01L 21/02554; H01L 29/24;
(Continued)

(56) References Cited

U.S. PATENT DOCUMENTS 10,269,832 B2 * 4/2019 Hayashi ................ H01L 27/088
2010/0171415 A1   7/2010 Akamatsu et al.
(Continued)

FOREIGN PATENT DOCUMENTS

CN   104795404 A   7/2015
CN   105140242 A   12/2015
(Continued)

OTHER PUBLICATIONS

First office action of Chinese application No. 201810796404.4 dated Apr. 14, 2020.

*Primary Examiner* — Bitew A Dinke
(74) *Attorney, Agent, or Firm* — Fay Sharpe LLP

(57) ABSTRACT

The present disclosure provides an oxide semiconductor layer and a preparation method thereof, device, substrate, and means, and belongs to the field of semiconductor technologies. The method includes: forming an oxide semiconductor layer having multiply types of regions on a substrate, at least two types of the multiple types of regions having different thicknesses, and adjusting an oxygen content of at least one type of regions in the multiply types of regions, so that the oxygen content and the thickness in the multiple types of regions are positively correlated.

16 Claims, 12 Drawing Sheets

(51) Int. Cl.
*C23C 16/56* (2006.01)
*H01L 27/12* (2006.01)
*H01L 29/24* (2006.01)
*H01L 29/786* (2006.01)

(52) U.S. Cl.
CPC .. *H01L 21/02631* (2013.01); *H01L 21/02664* (2013.01); *H01L 27/1225* (2013.01); *H01L 29/24* (2013.01); *H01L 29/7869* (2013.01)

(58) Field of Classification Search
CPC ......... H01L 21/02631; H01L 29/66969; H01L 27/1225; H01L 27/1285; H01L 21/67011
See application file for complete search history.

(56) References Cited

U.S. PATENT DOCUMENTS

| | | | | |
|---|---|---|---|---|
| 2013/0034708 | A1* | 2/2013 | Ryu | H01L 21/6715 428/212 |
| 2013/0048978 | A1* | 2/2013 | Watanabe | H01L 29/7869 257/43 |
| 2014/0117359 | A1* | 5/2014 | Yuan | H01L 27/1225 257/59 |
| 2016/0308061 | A1* | 10/2016 | Yang | H01L 29/24 |
| 2017/0301707 | A1 | 10/2017 | Jiang et al. | |
| 2017/0338245 | A1 | 11/2017 | Park et al. | |
| 2017/0352540 | A1* | 12/2017 | Watanabe | C23C 14/566 |
| 2019/0074357 | A1* | 3/2019 | Lai | H01L 29/513 |
| 2019/0221588 | A1* | 7/2019 | Su | H01L 27/1259 |
| 2019/0233299 | A1* | 8/2019 | Zhang | C01G 15/006 |
| 2019/0385518 | A1 | 12/2019 | Hwang et al. | |

FOREIGN PATENT DOCUMENTS

| | | | | |
|---|---|---|---|---|
| CN | 106356378 | A | 1/2017 | |
| CN | 106409995 | A | 2/2017 | |
| CN | 107403826 | A | 11/2017 | |
| CN | 107507573 | A | 12/2017 | |
| CN | 107863451 | A | 3/2018 | |
| CN | 108269529 | A | 7/2018 | |
| JP | 2010118509 | A | 5/2010 | |
| JP | 5125686 | B2 | 1/2013 | |
| WO | WO-2018054111 | A1 * | 3/2018 | ........... G09G 3/3283 |
| WO | WO2018054111 | A1 * | 3/2018 | |

* cited by examiner

OXIDE SEMICONDUCTOR LAYER AND PREPARATION METHOD THEREOF, DEVICE, SUBSTRATE AND MEANS

CROSS-REFERENCE TO RELATED APPLICATION

This application claims priority to Chinese Patent Application No. 201810796404.4, filed on Jul. 19, 2018 and entitled "METHOD AND DEVICE FOR PREPARING OXIDE SEMICONDUCTOR LAYER", the contents of which are incorporated herein by reference in their entirety.

TECHNICAL FIELD

The present disclosure relates to the field of semiconductor technologies, and more particularly to, an oxide semiconductor layer and a preparation method thereof, device, substrate and means.

BACKGROUND

With the development of science and technology, display panels are used more and more widely. The display panel includes a substrate and a plurality of pixel units located on the substrate, and each pixel unit generally includes an oxide semiconductor layer.

In the process of preparing the oxide semiconductor layer, it needs to dispose a plurality of target materials used in forming the oxide semiconductor layer to face the substrate. Then, charged particles are introduced to one side of the plurality of target materials, and an orthogonal electromagnetic field is applied to the plurality of target materials, so that the charged particles bombard the target materials under the action of the orthogonal electromagnetic field, thereby hitting a portion of materials of the target materials out and sputtering these materials onto the substrate to form an oxide semiconductor layer on the substrate.

SUMMARY

The present disclosure provides an oxide semiconductor layer, and a preparation method thereof, device, substrate and means, with technical solutions as follows.

In one aspect, there is provided a method for preparing an oxide semiconductor layer, including:

forming an oxide semiconductor layer having multiple types of regions on a substrate, at least two types of the multiple types of regions having different thicknesses;

adjusting an oxygen content of at least one type of regions in the multiple types of regions, so that the oxygen content and the thickness in the multiple types of regions are positively correlated.

Optionally, the adjusting an oxygen content of at least one type of regions in the multiple types of regions comprises: applying an oxygen element to the at least one type of regions to adjust the oxygen content of the at least one type of regions.

Optionally, the method further includes:
annealing the oxide semiconductor layer when adjusting the oxygen content of the at least one type of regions in the multiple types of regions.

Optionally, the annealing the oxide semiconductor layer includes: annealing the oxide semiconductor layer by using an annealing furnace; and prior to the annealing the oxide semiconductor layer by using an annealing furnace, the method further includes: vacuumizing the annealing furnace.

Optionally, the at least one type of regions includes each region of the oxide semiconductor layer.

Optionally, the at least one type of regions includes: parts of the multiple types of regions.

Optionally, applying an oxygen element to the at least one type of regions includes:
providing oxygen to a side of the substrate, on which the oxide semiconductor layer is located;
irradiating the at least one type of regions with ultraviolet rays to dissociate the oxygen as oxygen ions which then enter the at least one type of regions;
wherein energy of the ultraviolet rays for irradiating the at least one type of regions and the thickness of the at least one type of regions are positively correlated.

Optionally, wavelength of the ultraviolet rays for irradiating the multiple types of regions and the thickness of the multiple types of regions are negatively correlated.

Optionally, the forming an oxide semiconductor layer having multiple types of regions on a substrate includes:
forming the oxide semiconductor layer on the substrate by a magnetron sputtering method.

Optionally, the material of the oxide semiconductor layer is indium gallium zinc oxide or indium tin zinc oxide.

Optionally, the at least one type of regions includes: a first type of regions having a thickness of 1090 angstroms, and a second type of regions having a thickness of 1063 angstroms; and the ultraviolet rays irradiating the first type of regions have a wavelength of 30 nm, and the ultraviolet rays irradiating the second type of regions have a wavelength of 100 nm.

In another aspect, there is provided a device for preparing an oxide semiconductor layer, including: a coating apparatus for forming an oxide semiconductor layer having multiple types of regions on a substrate, at least two types of the multiple types of regions having different thicknesses; and an oxygen content adjusting apparatus for adjusting an oxygen content of at least one type of regions in the multiple types of regions, so that the oxygen content and the thickness in the multiple types of regions are positively correlated.

Optionally, the oxygen content adjusting apparatus is configured to apply an oxygen element to the at least one type of regions to adjust the oxygen content of the at least one type of regions.

Optionally, the device further includes:
an annealing furnace configured to anneal the oxide semiconductor layer,
wherein the oxygen content adjusting apparatus is configured to adjust the oxygen content of the at least one type of regions in the multiple types of regions within the annealing furnace.

Optionally, the device further includes: a vacuum generating apparatus configured to vacuumize the annealing furnace.

Optionally, the at least one type of regions includes each region of the oxide semiconductor layer.

Optionally, the at least one type of regions includes: parts of the multiple types of regions.

Optionally, the oxygen content adjusting apparatus includes: an oxygen introducing pump and an ultraviolet lamp assembly; the oxygen introducing pump is configured to provide oxygen to a side of the substrate, on which the oxide semiconductor layer is located; the ultraviolet lamp assembly is configured to irradiate the at least one type of regions with ultraviolet rays to dissociate the oxygen as oxygen ions, which then enter the at least one type of regions, wherein energy of the ultraviolet rays emitted from the ultraviolet lamp assembly to the at least one type of regions and the thickness of the at least one type of regions are positively correlated.

Optionally, the coating apparatus includes: a magnetron sputtering apparatus configured to form the oxide semiconductor layer on the substrate by a magnetron sputtering method.

Optionally, the multiple types of regions include: a first type of regions having a thickness of 1090 angstroms, and a second type of regions having a thickness of 1063 angstroms; and the ultraviolet rays emitted from the ultraviolet lamp assembly to the first type of regions have a wavelength of 30 nm, and the ultraviolet rays emitted from the ultraviolet lamp assembly to the second type of regions have a wavelength of 100 nm.

Optionally, the ultraviolet lamp assembly includes a first ultraviolet lamp and a second ultraviolet lamp; the first ultraviolet lamp is configured to irradiate the first type of regions with ultraviolet rays, and the second ultraviolet lamp is configured to irradiate the second type of regions with ultraviolet rays.

In a further aspect, there is provided an oxide semiconductor layer having multiple types of regions, wherein at least two types of the multiple types of regions have different thicknesses, and oxygen content and thickness in the multiple types of regions are positively correlated.

In a further another aspect, there is provided a semiconductor means, including the oxide semiconductor layer according to the above aspects of the present disclosure.

In a further another aspect, there is provided a display substrate, including the oxide semiconductor layer according to the above aspects of the present disclosure.

In a further another aspect, there is provided a display device, including the display substrate according to the above aspects of the present disclosure.

DETAILED DESCRIPTION

The present disclosure will be described in detail with reference to the accompanying drawings, to present the principles, technical solutions and advantages in the present disclosure more clearly. Apparently, the described examples are merely some examples, rather than all examples. Based on the examples of the present disclosure, all other examples derived by those of ordinary skill in the art without creative efforts shall be within the protection scope of the present disclosure.

Figure 1:
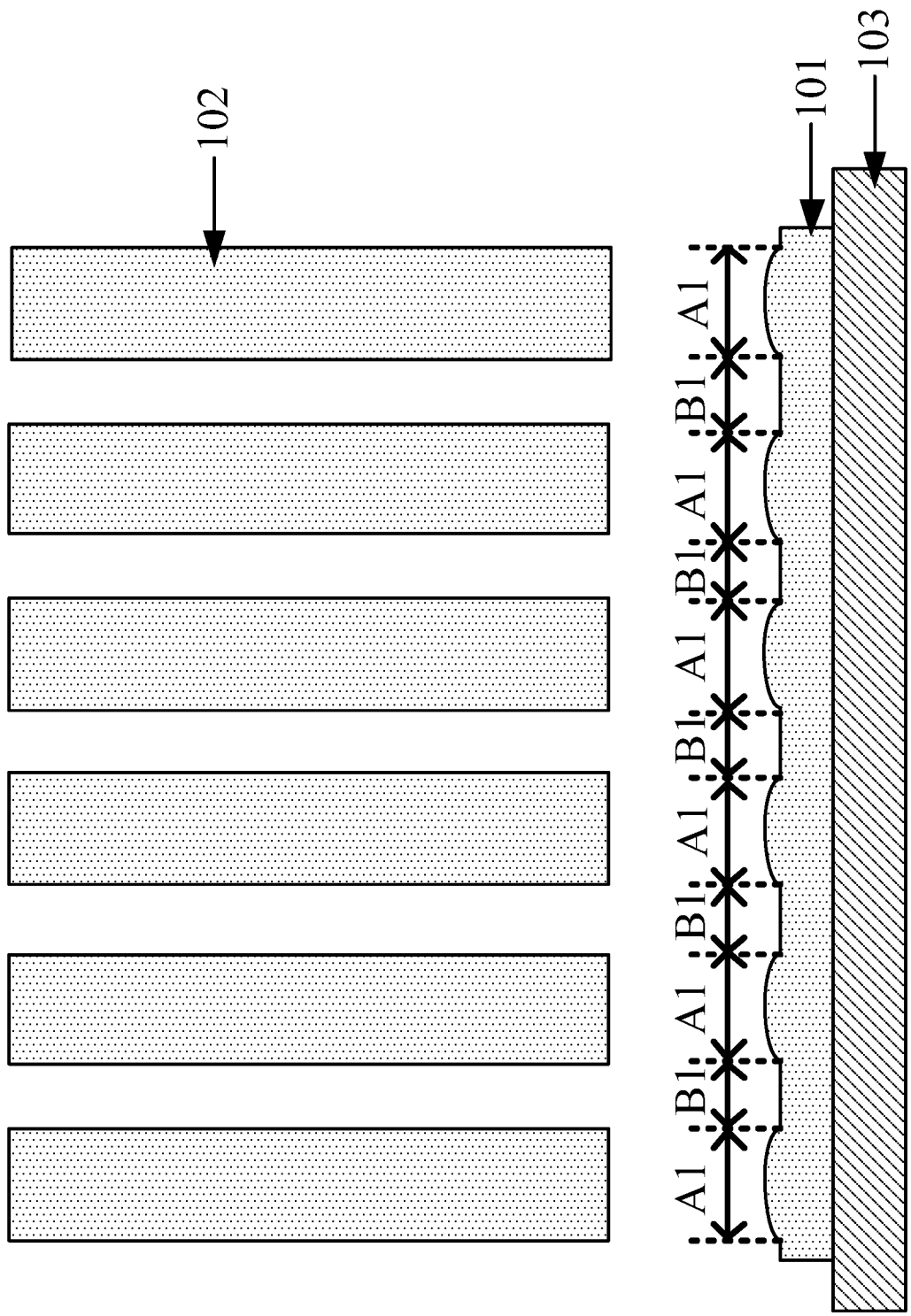
FIG. 1 is a schematic diagram of an environment for preparing an active layer provided by the related art.

With the development of science and technology, display panels are used more and more widely. The display panel includes a substrate and a plurality of pixel units on the substrate, and the pixel units generally include an oxide semiconductor layer (such as an active layer in a thin film transistor). As shown in FIG. 1, in the process of preparing an active layer 101, it needs to dispose a plurality of target materials 102 used in forming the active layer 101 to face the substrate 103; and charged particles are introduced to the side of the substrate 103 close to the target materials (not shown in FIG. 1). Afterwards, an orthogonal electromagnetic field (not shown in FIG. 1) can be applied to the plurality of target materials 102, so that the charged particles bombard the target materials 102 under the action of the orthogonal electromagnetic field, thereby hitting a portion of materials of the target materials 102 out and sputtering these materials onto the substrate 103 to obtain the active layer 101.

However, in such process of forming the active layer 101 on the substrate 103, the resultant active layer 101 within the region A1 on the substrate 103, which rightly face the target materials 102, would have a greater thickness, and the resultant active layer 101 within the region A2 on the substrate 103, which do not face the target materials 102, would have a smaller thickness. Therefore, the active layer 101 would include multiple types of regions varied in thickness. Moreover, since the resistance of any one type of regions in the active layer 101 is negatively correlated with the thickness of these regions, the active layer 101 would include multiple types of regions varied in resistance; and the plurality of regions would have different conduction currents (i.e. the source-drain current in the thin film transistor). Examples of the present disclosure provide methods for manufacturing an oxide semiconductor layer, and the oxide semiconductor layer manufactured through these methods would have more consistent conduction currents among the various types of regions.

Figure 2:
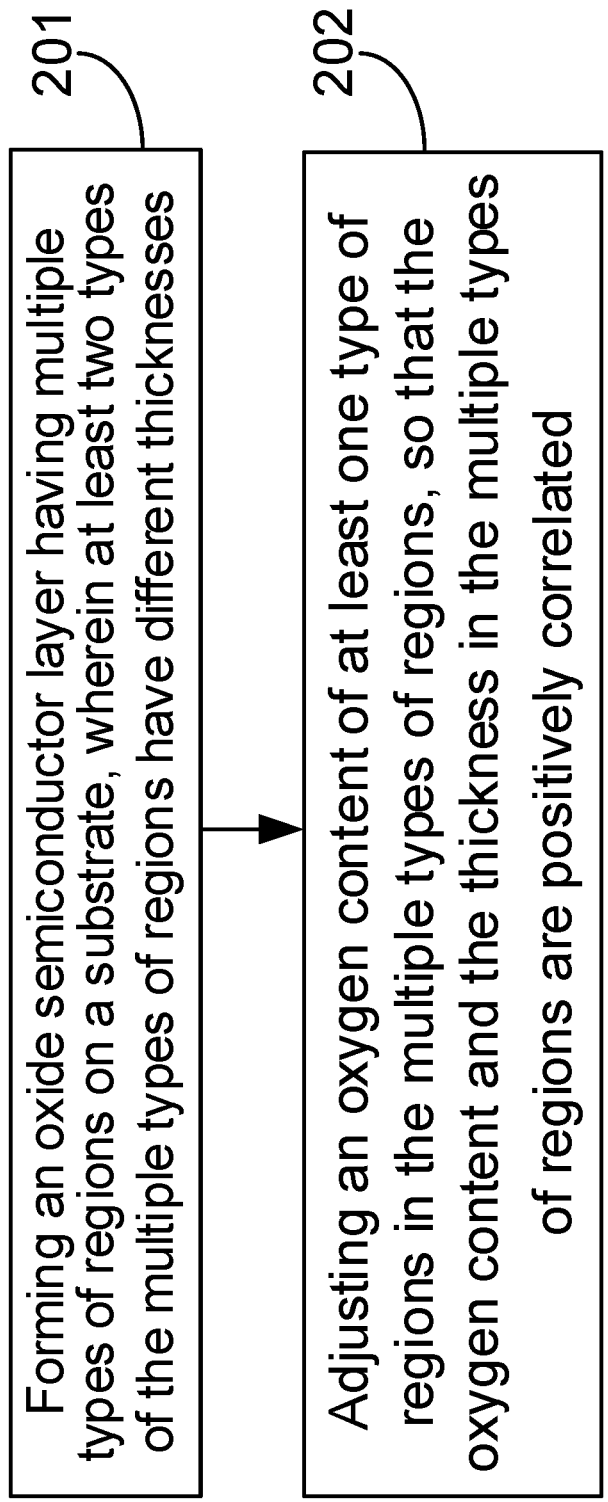
FIG. 2 is a flow chart of a method for preparing an oxide semiconductor layer according to examples of the present disclosure.

FIG. 2 is a flow chart of another method for preparing an oxide semiconductor layer according to examples of the present disclosure. As shown in FIG. 2, the method for preparing the oxide semiconductor layer may include:

step 201, forming an oxide semiconductor layer having multiple types of regions on a substrate, wherein at least two types of the multiple types of regions have different thicknesses; and step 202, adjusting an oxygen content of at least one type of regions in the multiple types of regions, so that the oxygen content and the thickness in the multiple types of regions are positively correlated.

In summary, in the methods for preparing the oxide semiconductor layer according to examples of the present disclosure, after forming an oxide semiconductor layer having multiple types of regions on a substrate, the oxygen content of at least one type of regions in the oxide semiconductor layer is adjusted, so that the oxygen content and the thickness in the multiple types of regions are positively correlated. Since the conduction current of a region in the oxide semiconductor layer is positively correlated with the thickness of the region and is negatively correlated with the oxygen content of the region, the difference in conduction current among each type of regions in the oxide semiconductor layer can be reduced when the oxygen content and the thickness of the multiple types of regions are in a positive correlation. Consequently, the non-uniformity in the display brightness of a display panel caused by the target materials could be alleviated, and the display effect of the display panel could be improved.

The negative correlation between the oxygen content of the oxide semiconductor layer and the conduction current is explained below, by way of an example, with the oxide semiconductor layer exemplarily being an active layer in a thin film transistor.

Exemplarily, the source-drain current (equivalent to the conduction current of the active layer) in the thin film transistor can be calculated via the formula $$I_{DS} = \frac{1}{2} \times \mu \times C \times \frac{W}{L} \times (V_{GS} - V_{th})^2,$$

wherein $I_{DS}$ represents the source-drain current; $\mu$ represents the mobility of the active layer; C represents capacitance formed by a gate electrode with the active layer in the thin film transistor;

$$\frac{W}{L}$$

represents a width-to-length ratio of a channel in the active layer; $V_{GS}$ represents a voltage difference between a gate and a source in the thin film transistor; and $V_{th}$ represents a threshold voltage of the active layer.

As can be seen from this formula that, the mobility $\mu$ of the active layer is positively correlated with the source-drain current $I_{DS}$; and since the mobility of the active layer is negatively correlated with the oxygen content of the active layer, the oxygen content of the active layer is negatively correlated with the source-drain current $I_{DS}$ of the active layer, and the oxygen content of the oxide semiconductor layer is negatively correlated with the conduction current.

Figure 3:
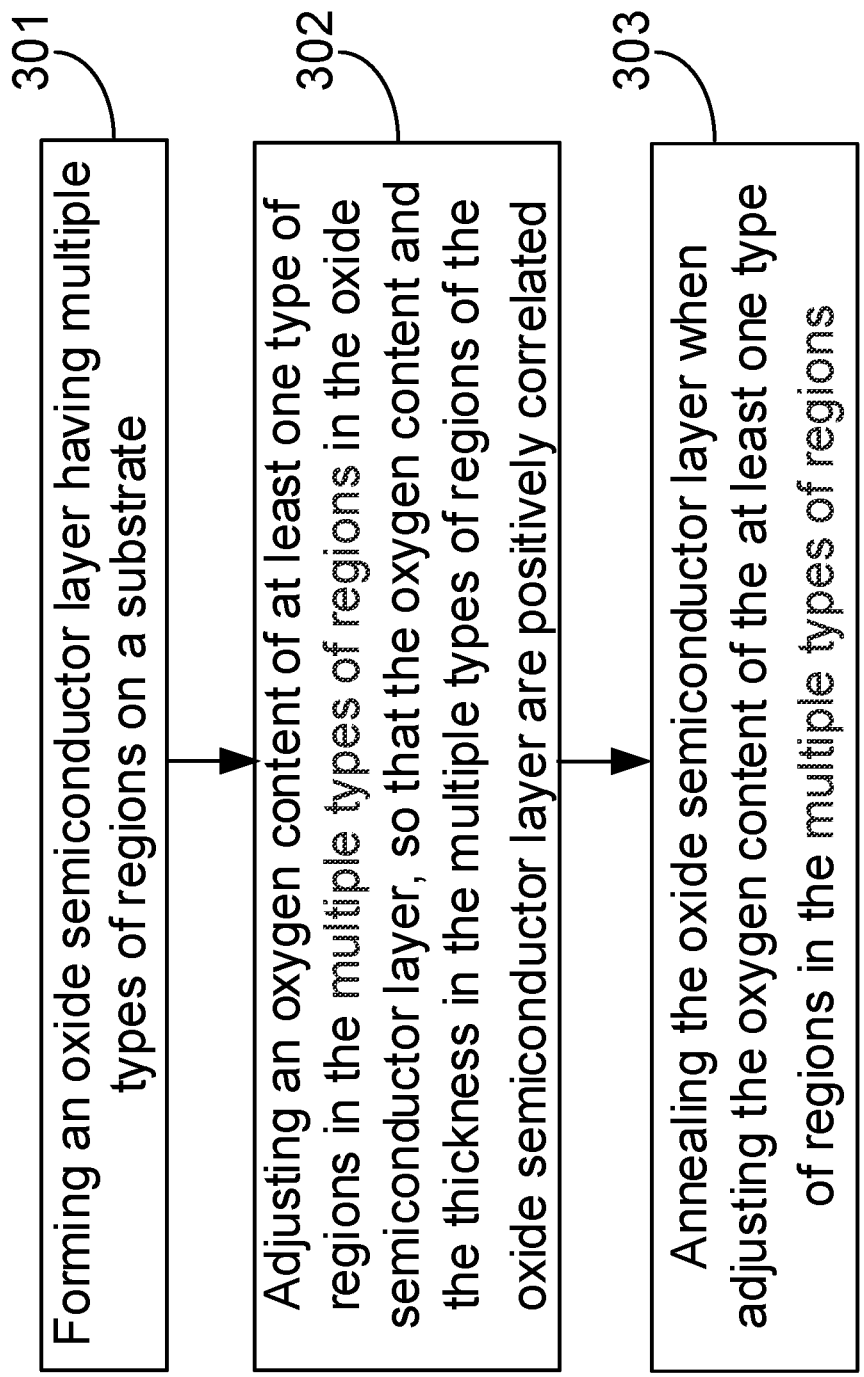
FIG. 3 is a flow chart of another method for preparing an oxide semiconductor layer according to examples of the present disclosure.

FIG. 3 is a flow chart of another method for preparing an oxide semiconductor layer according to examples of the present disclosure. As shown in FIG. 3, the method for preparing the oxide semiconductor layer may include:

step 301, forming an oxide semiconductor layer having multiple types of regions on a substrate.

Figure 4:
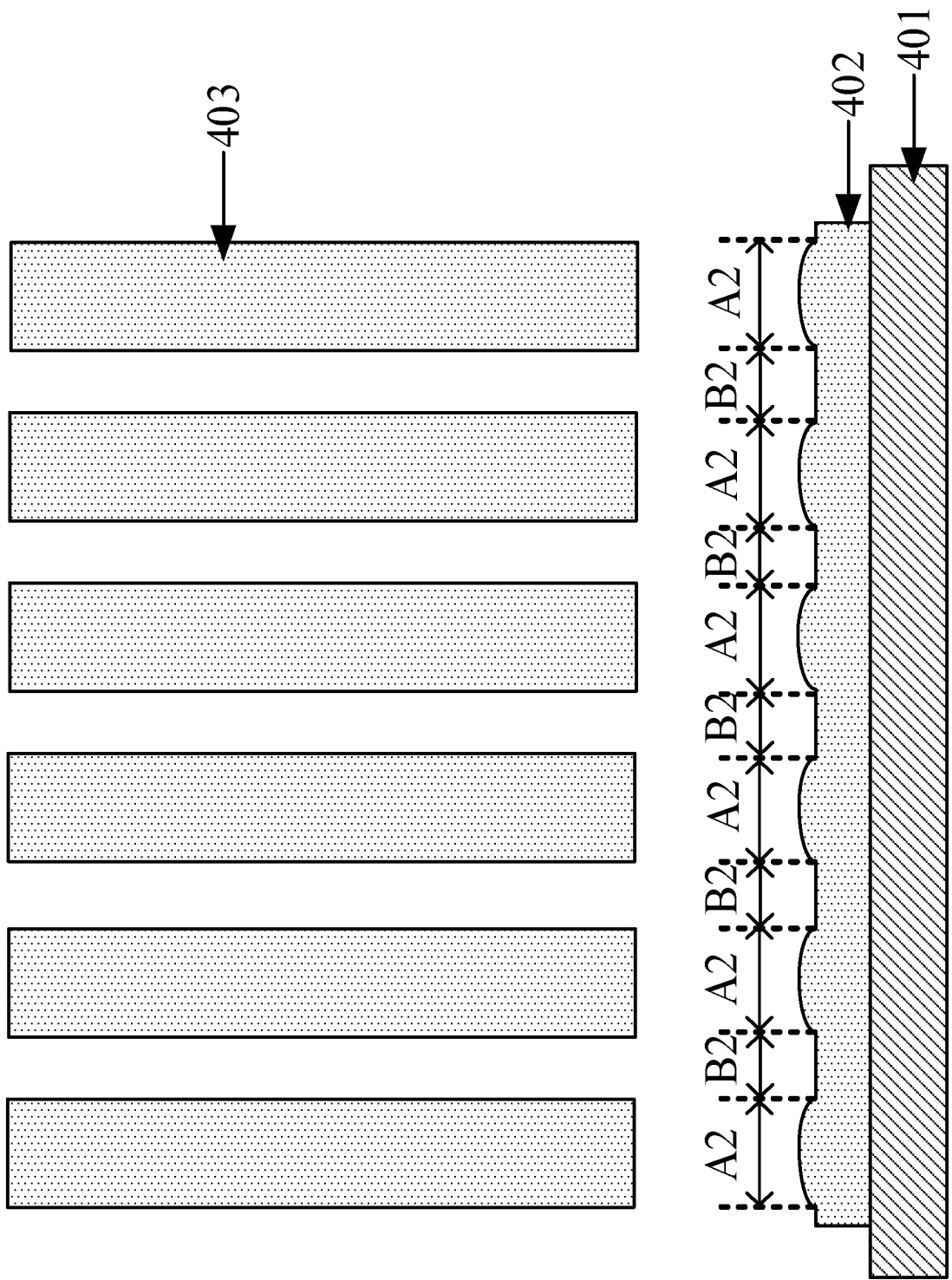
FIG. 4 is a schematic diagram of an environment for preparing an oxide semiconductor layer according to examples of the present disclosure.

Optionally, as shown in FIG. 4, an oxide semiconductor layer 402 having multiple types of regions can be formed on a substrate 401 in step 301, at least two types of the multiple types of regions having different thicknesses. Optionally, any two types of the multiple types of regions have different thicknesses. As shown in FIG. 4, the multiple types of regions may include: a first type of regions A2 and a second type of regions B2, and the first type of regions A2 have a greater thickness than the second type of regions B2.

Exemplarily, in a process of forming the oxide semiconductor layer 402 on the substrate 401, as shown in FIG. 4, a plurality of target materials 403 for forming the oxide semiconductor layer 402 can be provided to face the substrate 401; and charged particles are introduced to one side of the substrate 401 close to the target materials 403 (not shown in FIG. 4). Afterwards, an orthogonal electromagnetic field (not shown in FIG. 4) can be applied to the plurality of target materials 403, so that the charged particles bombard the target materials 403 under the action of the orthogonal electromagnetic field, thereby hitting a portion of materials of the target materials 403 out and sputtering these materials onto the substrate 401 to form the oxide semiconductor layer 402 shown in FIG. 4.

It should be noted that, the above method for forming the oxide semiconductor layer may be referred to as a magnetron sputtering method. The examples of the present disclosure are only illustrated by using a magnetron sputtering method to form the oxide semiconductor layer 402 on the substrate 401. Optionally, other preparation methods, such as a chemical vapor deposition method, could also be used in forming the oxide semiconductor layer 402 on the substrate 401 in step 301, which is not limited in the examples of the present disclosure. In addition, the apparatus used in step 301 to form the oxide semiconductor layer on the substrate may be referred to as a coating apparatus, and when the oxide semiconductor layer is formed via the magnetron sputtering method, the coating apparatus may include a magnetron sputtering apparatus.

It should also be noted that, the examples of the present disclosure are only illustrated by taking the oxide semiconductor layer 402 as an active layer in a thin film transistor as an example. Optionally, the oxide semiconductor layer 402 may also be other functional layers (such as an N-type semiconductor layer or a P-type semiconductor layer in an organic light-emitting diode) in the pixel units, which is not limited in the examples of the present disclosure.

Optionally, the oxide semiconductor layer 402 may include a material of indium gallium zinc oxide, or the oxide semiconductor layer 402 may not include the material of indium gallium zinc oxide, but include other materials such as indium tin zinc oxide), which is not limited in the examples of the present disclosure.

In step 302, an oxygen content of at least one type of regions in the multiple types of regions of the oxide semiconductor layer is adjusted, so that the oxygen content and the thickness in the multiple types of regions of the oxide semiconductor layer are positively correlated.

The adjusting the oxygen content of at least one type of regions in the multiple types of regions can be achieved by applying an oxygen element to the at least one type of regions. In the examples of the present disclosure, by way of an example, the at least one type of regions includes all of the multiple types of regions of the oxide semiconductor layer, that is, the at least one type of regions includes every region of the oxide semiconductor layer. Optionally, the at least one type of regions may only include parts of the regions of the multiple types of regions in the oxide semiconductor layer. For example, the oxide semiconductor layer has m types of regions, with m>1, and the at least one type of regions may be n types of regions among the m types of regions, with m>n≥1, which is not limited in the examples of the present disclosure.

Figure 5:
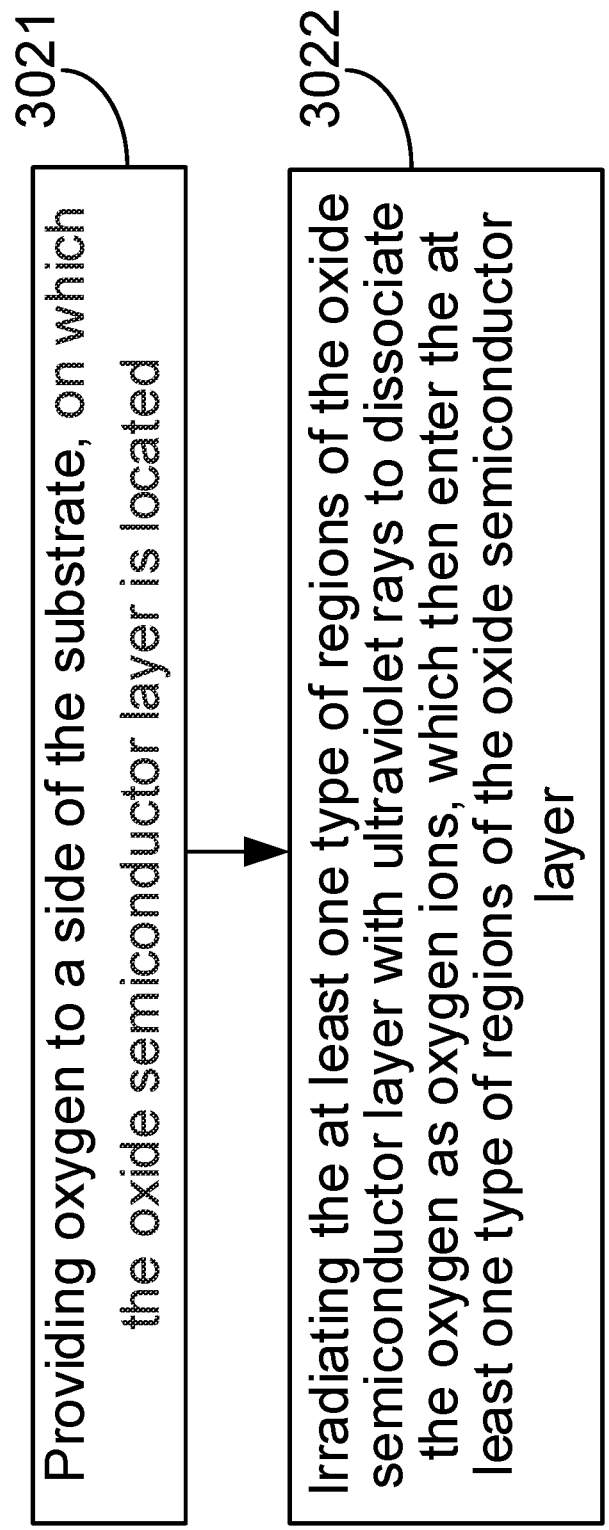
FIG. 5 is a flow chart of a method for adjusting an oxygen content of at least one type of regions in the multiple types of regions according to examples of the present disclosure.

Optionally, FIG. 5 is a flow chart of a method for adjusting an oxygen content of at least one type of regions in the multiple types of regions according to examples of the present disclosure. As shown in FIG. 5, step 302 may include:

step 3021, providing oxygen to a side of the substrate, on which the oxide semiconductor layer is located.

Figure 6:
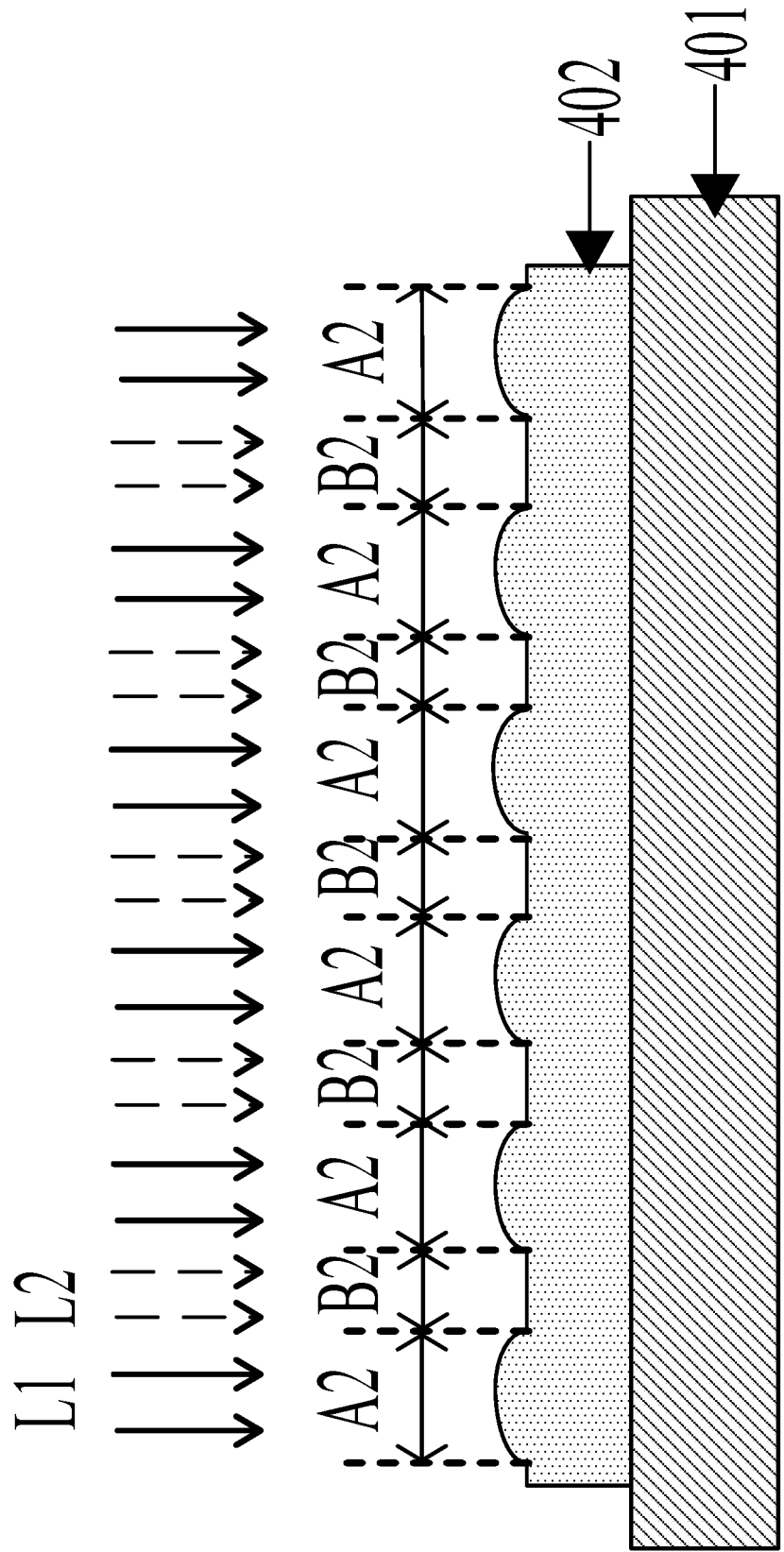
FIG. 6 is a schematic structural diagram of an oxide semiconductor layer according to examples of the present disclosure.

Exemplarily, as shown in FIG. 6, the oxygen (not shown in FIG. 6) may be introduced to a side of the substrate 401, on which the oxide semiconductor layer 402 is located, so that the oxygen is distributed on every surface region of the oxide semiconductor layer 402.

In step 3022, the at least one type of regions of the oxide semiconductor layer is irradiated with ultraviolet rays to dissociate the oxygen as oxygen ions, which then enter the at least one type of regions of the oxide semiconductor layer.

Once the oxygen is provided to the side of the substrate on which the oxide semiconductor layer is located, the at least one type of regions of the oxide semiconductor layer may be irradiated with ultraviolet rays, so as to adjust the oxygen content of the at least one type of regions.

When irradiating each of the at least one type of regions of the oxide semiconductor layer with ultraviolet rays, the energy of the ultraviolet rays used in irradiating the at least one type of regions and the thickness of the at least one type of regions are positively correlated. Among them, the energy of the ultraviolet rays may be represented by the wavelength, frequency or other parameters of the ultraviolet rays. In the examples of the present disclosure, by way of an example, the energy of the ultraviolet rays is represented by the wavelength, and then, the wavelength of the ultraviolet rays irradiating the at least one type of regions is negatively correlated with the thickness of the at least one type of regions.

Exemplarily, as shown in FIG. 6, the oxide semiconductor layer 402 may include: a first type of regions A2 having a thickness of 1090 angstroms (with 1 angstrom equal to 0.1 nanometer), and a second type of regions B2 having a thickness of 1063 angstroms. The wavelength of the ultraviolet rays L1 irradiating the first type of regions A2 is 30 nm, and the wavelength of the ultraviolet rays L2 irradiating the second type of regions B2 is 100 nm. Since the wavelength of ultraviolet rays is negatively correlated with the energy thereof, the energy of the ultraviolet rays L1 is greater than that of the ultraviolet rays L2. Further, after the ultraviolet rays L1 irradiate the first type of regions A2 and the ultraviolet rays L2 irradiate the second type of regions B2, the concentration of oxygen ions derived from the dissociation of oxygen in the vicinity of the first type of regions A2 is greater than that of the oxygen ions derived from the dissociation of oxygen in the vicinity of the second type of regions B2. Considering that the oxygen ions derived from the dissociation of oxygen are easier to enter the oxide semiconductor layer, there will be more oxygen ions entering the first type of regions A2 than that entering the second type of regions B2, and the mobility of the first type of regions A2 would be lower than that of the second type of regions B2.

It should be noted that in the examples of the present disclosure, only by way of examples, the multiple types of regions in the oxide semiconductor layer include two types of regions, and the ultraviolet rays irradiating the two types of regions include ultraviolet rays with two types of wavelengths. Optionally, the oxide semiconductor layer may also include more types of regions (such as three types of regions), and the ultraviolet rays irradiating the multiple types of regions may include ultraviolet rays having more types (for example, three types) of wavelengths, which are not limited in the examples of the present disclosure.

In addition, in the examples of the present disclosure, only by way of examples, the ultraviolet rays is used to irradiate every region of the oxide semiconductor layer. Optionally, it is also possible to only irradiate parts of the regions which have greater thickness in the oxide semiconductor layer with the ultraviolet rays. Exemplarily, after the oxygen is introduced into a preparation chamber, the ultraviolet rays may be only irradiated to the first type of regions A2 having the thickness of 1090 angstroms in FIG. 4. As such, the oxygen in the vicinity of the first type of regions A2 is dissociated into oxygen ions, and the resultant oxygen ions enter the first type of regions A2, so that the mobility of the first type of regions A2 would be lower than that of the second type of regions B2. The examples of the present disclosure do not put a limitation on this.

The apparatus used in step 302 for adjusting the oxygen content in the oxide semiconductor layer may be referred to as an oxygen content adjusting device. When step 302 includes the above steps 3021 and 3022, the oxygen content adjusting device may include: an oxygen introducing pump and an ultraviolet lamp assembly. Among them, the oxygen introducing pump is configured to perform step 3021 above, and the ultraviolet lamp assembly is configured to perform step 3022 above.

In step 303, the oxide semiconductor layer is annealed when the oxygen content of the at least one type of regions in the multiple types of regions is adjusted.

When the oxide semiconductor layer is annealed, the oxide semiconductor layer is in a high temperature environment, which is favorable for the oxide semiconductor layer to absorb the oxygen ions. Therefore, when adjusting the oxygen content of the at least one type of regions in the oxide semiconductor layer, the annealing of the oxide semiconductor layer can help to increase the efficiency of applying the oxygen ions to the oxide semiconductor layer.

It should be noted that in the examples of the present disclosure, only by way of examples, the oxide semiconductor layer is annealed when the oxygen content of the at least one type of regions in the multiple types of regions is adjusted. Optionally, the oxide semiconductor layer may also be annealed after the oxygen content of the at least one type of regions in the multiple types of regions has been adjusted; or the oxygen content of the at least one type of regions in the multiple types of regions may be annealed after the oxide semiconductor layer has been annealed. The examples of the present disclosure do not put a limitation on this.

In addition, when the oxide semiconductor layer only has one type of regions, the oxygen content of each region in the oxide semiconductor layer may not be adjusted. In this case, step 302 may be omitted, and the oxide semiconductor layer may be directly annealed. Optionally, when the oxide semiconductor layer only has one type of regions, it is also possible to only perform step 3021 to introduce the oxygen to the surface of the oxide semiconductor layer, without irradiating the oxide semiconductor layer with the ultraviolet rays, thereby supplementing various regions in the oxide semiconductor layer formed in step 301 with oxygen at the same level. In this case, step 3022 may be omitted.

It should also be noted that when annealing the oxide semiconductor layer, an annealing furnace may be useful in annealing the oxide semiconductor layer. Moreover, prior to annealing the oxide semiconductor layer by the annealing furnace, the annealing furnace may be vacuumized (for example, by a vacuum generating apparatus). In this way, when the oxide semiconductor layer is subjected to annealing and oxygen content adjusting, the oxide semiconductor layer can be kept in a closed environment, which may further improve the efficiency of annealing and oxygen content adjusting for the oxide semiconductor layer.

Optionally, prior to annealing the oxide semiconductor layer by using the annealing furnace, the annealing furnace may be not vacuumized. For example, prior to annealing the oxide semiconductor layer by using the annealing furnace, the oxygen semiconductor layer can be placed in the preparation chamber, which is then vacuumized (such as by using the vacuum generating apparatus), and then, the preparation chamber is placed in the annealing furnace to anneal and adjust the oxygen content for the oxide semiconductor layer within the preparation chamber. In another example, prior to annealing the oxide semiconductor layer by using the annealing furnace, the annealing furnace may be placed within the preparation chamber and the oxide semiconductor layer may be placed in the annealing furnace; the preparation chamber is vacuumized; and then, the oxide semiconductor layer in the annealing furnace is subjected to annealing and oxygen content adjusting.

In addition, in the examples of the present disclosure, oxygen ions are applied to the oxide semiconductor layer to adjust the oxygen content in the oxide semiconductor layer, so that the oxygen content and the thickness in the multiple types of regions of the oxide semiconductor layer are positively correlated. Optionally, the oxygen content in the oxide semiconductor layer may also be adjusted by removing the oxygen ions in the oxide semiconductor layer, thereby resulting in that the oxygen content and thickness in the multiple types of regions of the oxide semiconductor layer are in a positive correlation. The examples of the present disclosure do not put a limitation on this.

In summary, in the methods for preparing oxide semiconductor layers according to the examples of the present disclosure, after forming an oxide semiconductor layer having multiple types of regions on a substrate, the oxygen content of at least one type of regions in the oxide semiconductor layer is adjusted, so that the oxygen content and the thickness in the multiple types of regions are positively correlated. Since the conduction current in a region of the oxide semiconductor layer is positively correlated with the thickness of the region and is negatively correlated with the oxygen content of the region, the difference in conduction current among each type of regions in the oxide semiconductor layer can be reduced when the oxygen content and the thickness of the multiple types of regions are in a positive correlation. Consequently, the non-uniformity in the display brightness of a display panel caused by the target materials could be alleviated, and the display effect of the display panel could be improved.

Figure 7:
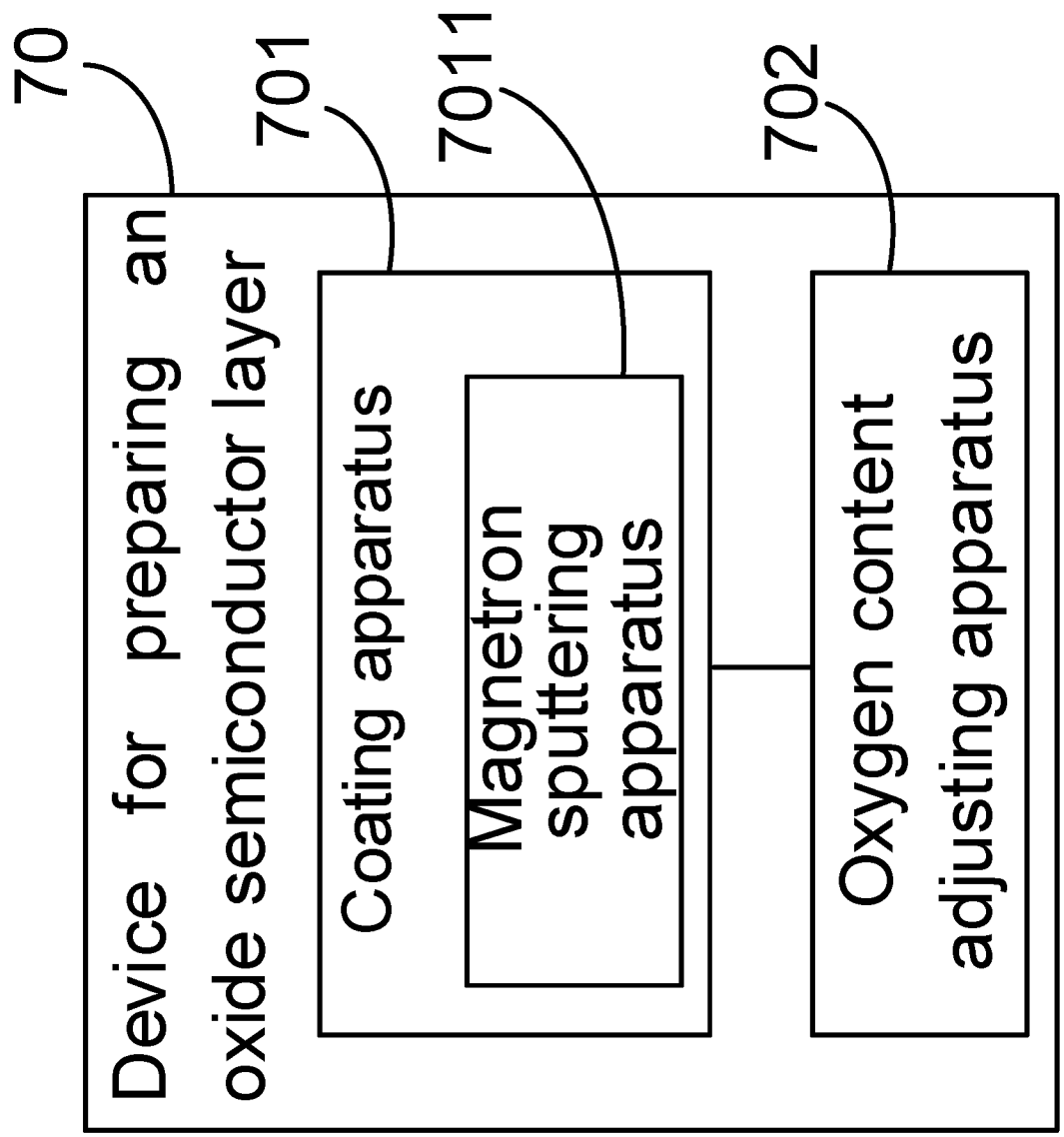
FIG. 7 is a schematic structural diagram of a device for preparing an oxide semiconductor layer according to examples of the present disclosure.

FIG. 7 is a schematic structural diagram of a device for preparing an oxide semiconductor layer according to examples of the present disclosure. As shown in FIG. 7, the device for preparing the semiconductor layer 70 may include:

a coating apparatus 701 for forming an oxide semiconductor layer having multiple types of regions on a substrate, wherein at least two types of the multiple types of regions have different thicknesses; and an oxygen content adjusting apparatus 702 for adjusting an oxygen content of at least one type of regions in the multiple types of regions, so that the oxygen content and the thickness in the multiple types of regions are positively correlated.

In summary, in the devices for preparing the oxide semiconductor layers according to the examples of the present disclosure, after the coating apparatus forms an oxide semiconductor layer having multiple types of regions on a substrate, the oxygen content adjusting apparatus adjusts the oxygen content of at least one type of regions in the oxide semiconductor layer so that the oxygen content and the thickness in the multiple types of regions are positively correlated. Since conduction current in a region of the oxide semiconductor layer is positively correlated with the thickness of the region and is negatively correlated with the oxygen content of the region, the difference in conduction current among each type of regions in the oxide semiconductor layer can be reduced when the oxygen content and the thickness of the multiple types of regions are in a positive correlation. Consequently, the non-uniformity in the display brightness of a display panel caused by the target materials could be alleviated, and the display effect of the display panel could be improved.

Optionally, the coating apparatus 701 shown in FIG. 7 may include: a magnetron sputtering apparatus 7011 for forming the oxide semiconductor layer on the substrate via a magnetron sputtering method.

Figure 8:
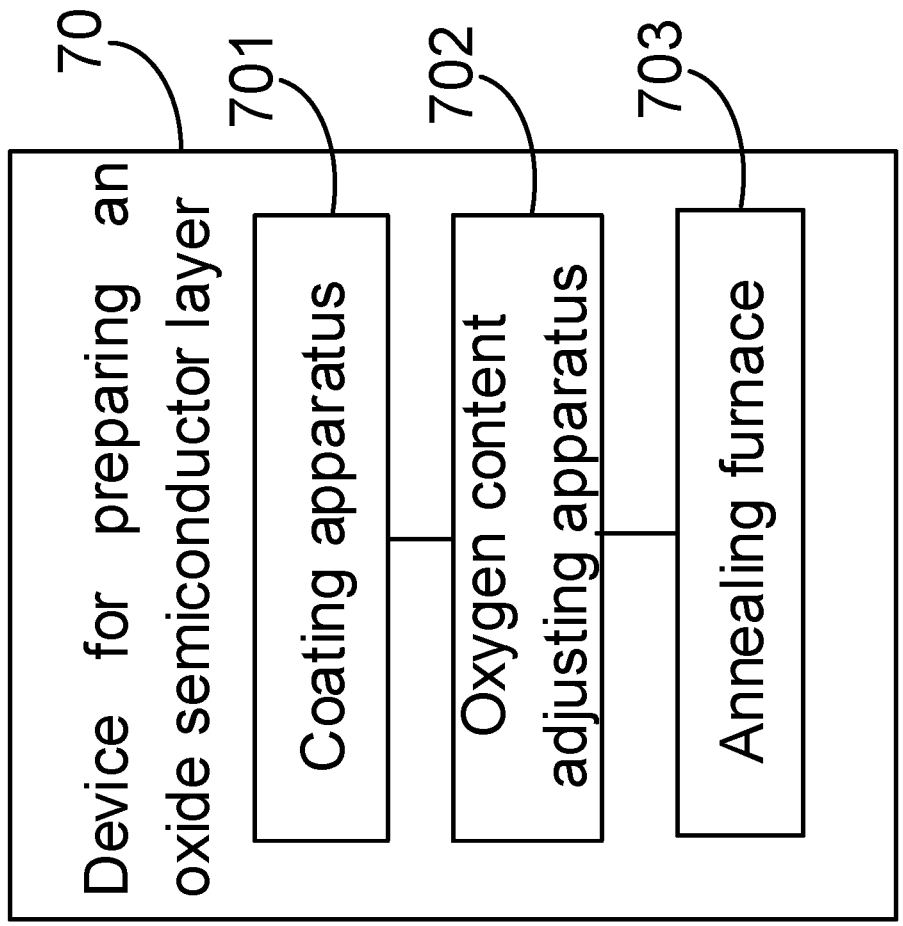
FIG. 8 is a schematic structural diagram of another device for preparing an oxide semiconductor layer according to examples of the present disclosure.
Figure 9:
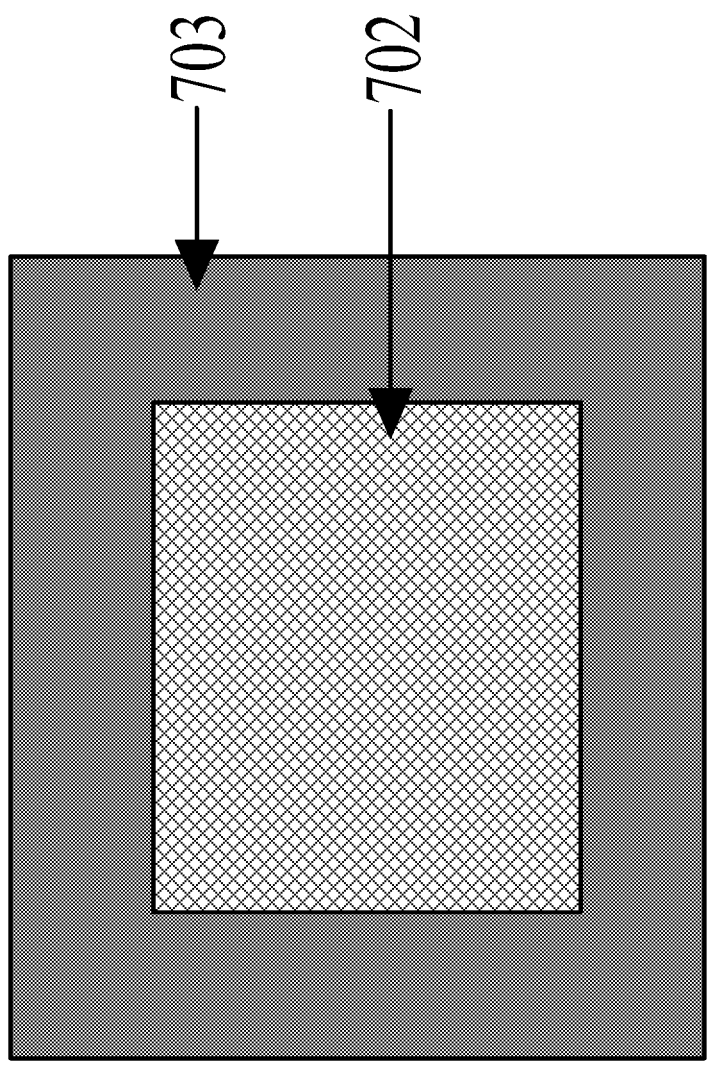
FIG. 9 is a schematic diagram showing a relative position relationship between an oxygen content adjusting apparatus and an annealing furnace according to examples of the present disclosure.

Optionally, as shown in FIG. 8, the device for preparing the oxide semiconductor layer 70 may further include: an annealing furnace 703, which could be configured to anneal the oxide semiconductor layer. Optionally, the annealing furnace 703 may be configured to anneal the oxide semiconductor layer when oxygen ions are applied to the oxide semiconductor layer. Here, the oxygen content adjusting apparatus 702 may be located within the annealing furnace 703 (as shown in FIG. 9); or the oxygen content adjusting apparatus 702 may be located outside the annealing furnace 703 but connected with the annealing furnace 703. The relative positional relationship between the oxygen content adjusting apparatus 702 and the annealing furnace 703 is not shown in FIG. 8. The oxygen content adjusting apparatus 702 could be configured to adjust the oxygen content of the at least one type of regions in the multiple types of regions within the annealing furnace 703.

In the examples of the present disclosure, by way of an example, the annealing furnace 703 anneals the oxide semiconductor layer when the oxygen content adjusting apparatus 702 is adjusting the oxygen content in the oxide semiconductor layer. Optionally, the annealing furnace 703 may also be configured to anneal the oxide semiconductor layer before or after the oxygen content adjusting apparatus 702 adjusts the oxygen content in the oxide semiconductor layer. Here, the oxygen content adjusting apparatus 702 may be located either outside or inside the annealing furnace 703, which is not limited in the examples of the present disclosure.

Optionally, the oxygen content adjusting apparatus 702 is configured to apply oxygen element to the at least one type of regions of the oxide semiconductor layer to adjust the oxygen content of the at least one type of regions. The at least one type of regions may include: each region of the multiple types of regions, or parts of the multiple types of regions in the oxide semiconductor layer.

Figure 10:
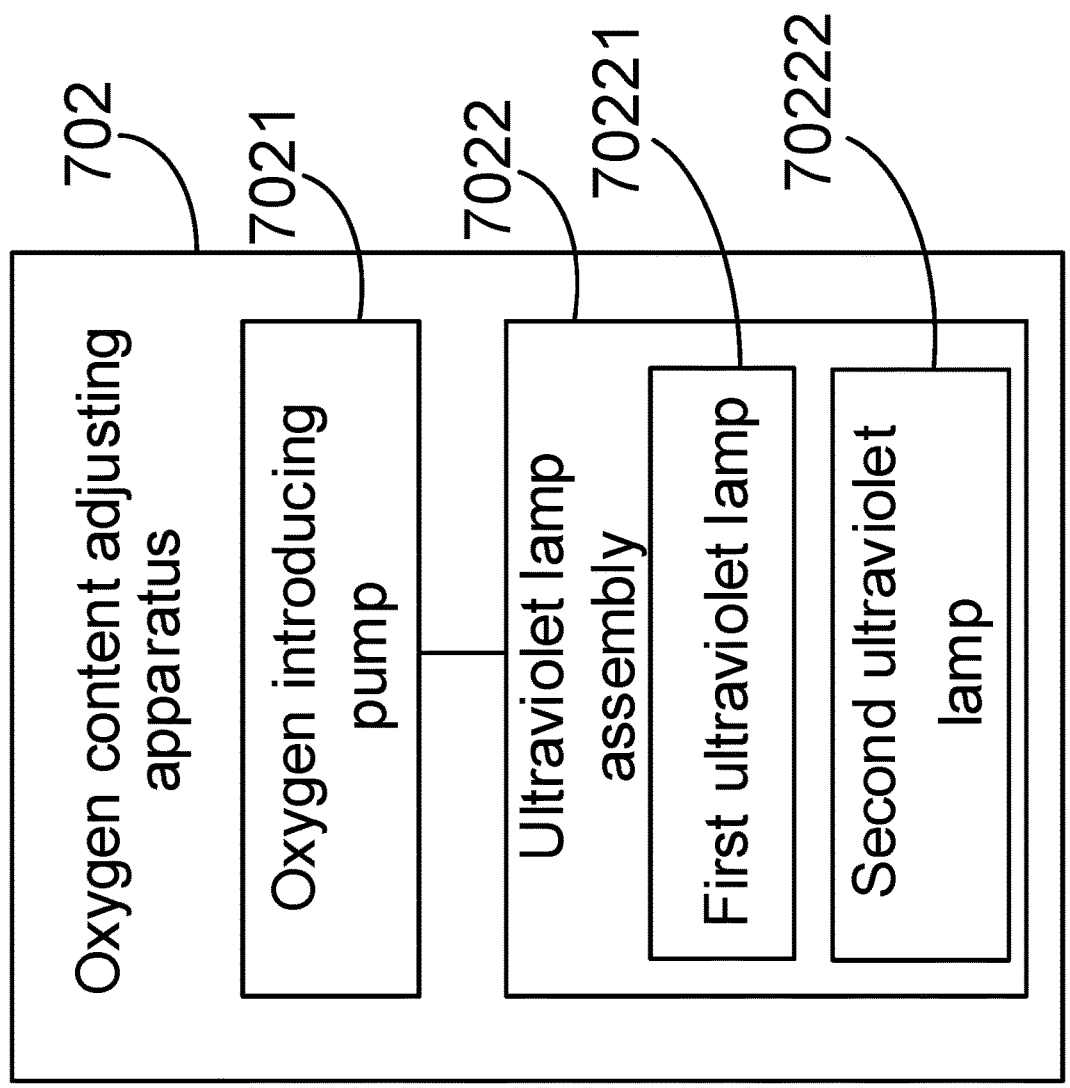
FIG. 10 is a schematic structural diagram of an oxygen content adjusting apparatus according to examples of the present disclosure.

Optionally, as shown in FIG. 10, the oxygen content adjusting apparatus 702 may include: an oxygen introducing pump 7021 and an ultraviolet lamp assembly 7022. Among them, the oxygen introducing pump 7021 is configured to provide oxygen to a side of the substrate on which the oxide semiconductor layer is located. The ultraviolet lamp assembly 3022 can be configured to irradiate the at least one type of regions of the oxide semiconductor layer with ultraviolet rays to dissociate the oxygen so as to obtain oxygen ions, which then enter the at least one type of regions, Here, the energy of the ultraviolet rays emitted from the ultraviolet lamp assembly 7022 to the at least one type of regions is positively correlated with the thickness of the at least one type of regions.

Optionally, the at least one type of regions of the oxide semiconductor layer may include: a first type of regions having a thickness of 1090 angstroms, and a second type of regions having a thickness of 1063 angstroms; and the ultraviolet rays irradiating the first type of regions has a wavelength of 30 nm, and the ultraviolet rays irradiating the second type of regions has a wavelength of 100 nm. Exemplarily, by continuing referring to FIG. 10, the ultraviolet lamp assembly 7022 may include a first ultraviolet lamp 70221 and a second ultraviolet lamp 70222, wherein the first ultraviolet lamp is configured to irradiate the first type of regions having a thickness of 1090 angstroms with the ultraviolet rays having the wavelength of 30 nm; and the second ultraviolet lamp is configured to irradiate the second type of regions having a thickness of 1063 angstroms with the ultraviolet rays having the wavelength of 100 nm.

Figure 11:
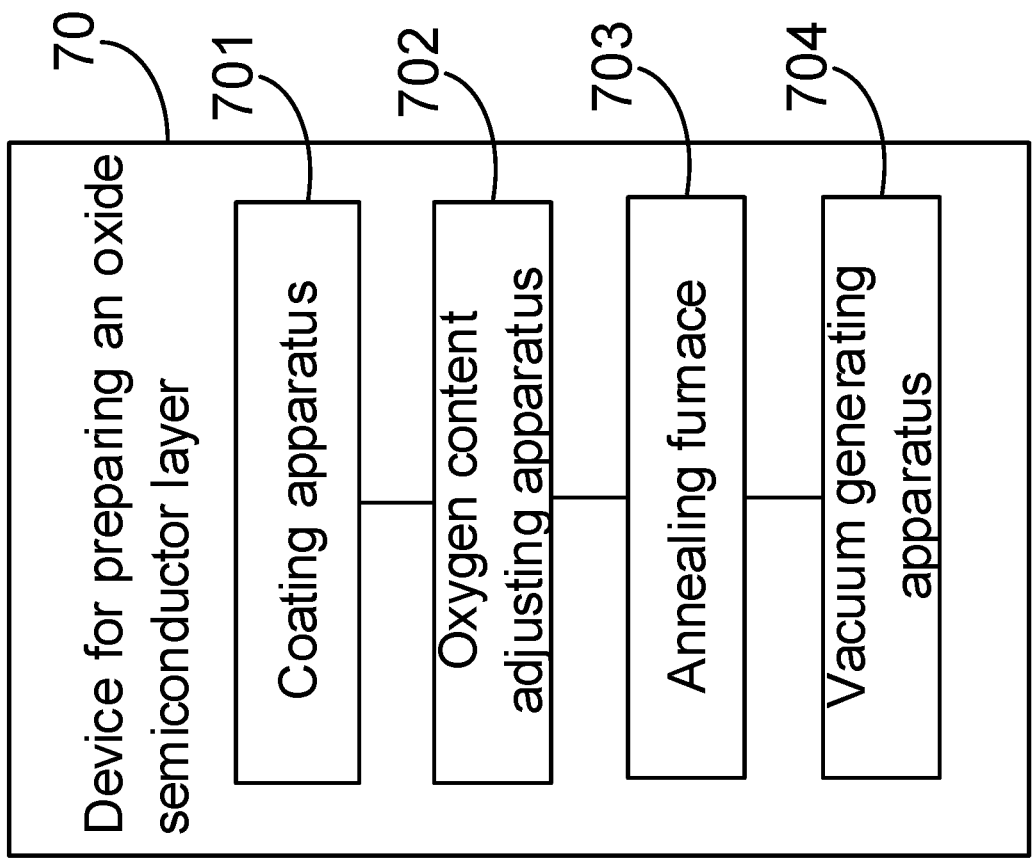
FIG. 11 is a schematic structural diagram of another device for preparing an oxide semiconductor layer according to examples of the present disclosure.

Optionally, as shown in FIG. 11, on the basis of FIG. 8, the device for preparing the oxide semiconductor layer 70 further includes: a vacuum generating apparatus 704 for vacuumizing the annealing furnace 703. For example, prior to annealing the oxide semiconductor layer by the annealing furnace 703, the annealing furnace 703 may be vacuumized by the vacuum generating apparatus 704.

Figure 12:
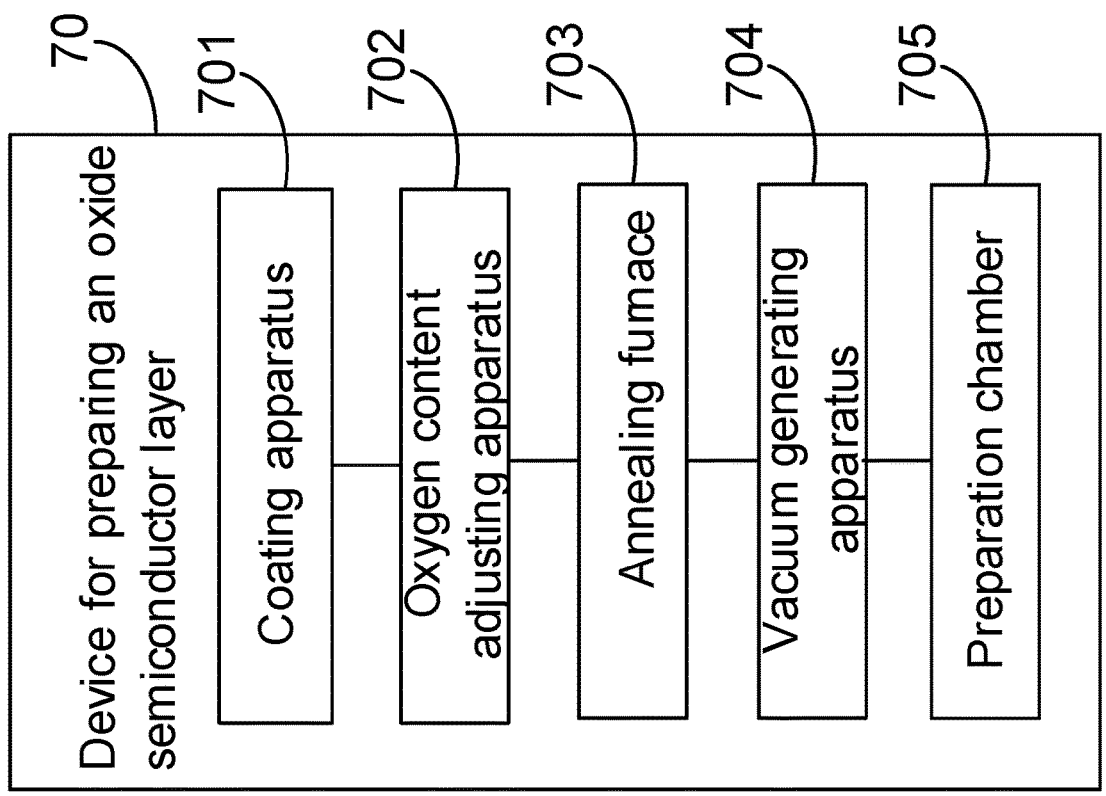
FIG. 12 is a schematic structural diagram of another device for preparing an oxide semiconductor layer according to examples of the present disclosure.

Optionally, the annealing furnace 703 may not be vacuumized before being used to anneal the oxide semiconductor layer. As shown in FIG. 12, on the basis of FIG. 11, the device or preparing the oxide semiconductor layer 70 further includes: a preparation chamber 705. For example, before being annealed by using the annealing furnace 703, the oxygen semiconductor layer may be placed in a preparation chamber 705. Then, the preparation chamber 705 is vacuumized by the vacuum generating apparatus 704 above, and is placed within the annealing furnace 703 to anneal and adjust the oxygen content for the oxide semiconductor layer located within the preparation chamber 705. In other examples, prior to being used to anneal the oxide semiconductor layer, the annealing furnace 703 is placed within the preparation chamber 705 and the oxide semiconductor layer is put into the annealing furnace 703. Then, the vacuum generating apparatus 704 above is used to vacuumize the preparation chamber 705; and the oxide semiconductor layer in the annealing furnace 703 is subjected to the annealing and oxygen content adjusting.

In summary, in the devices for preparing the oxide semiconductor layers according to the examples of the present disclosure, after coating apparatus is used to form an oxide semiconductor layer having multiple types of regions on a substrate, the oxygen content adjusting apparatus adjusts the oxygen content of at least one type of regions in the oxide semiconductor layer so that the oxygen content and the thickness in the multiple types of regions are positively correlated. Since the conduction current of a region in the oxide semiconductor layer is positively correlated with the thickness of the region and is negatively correlated with the oxygen content of the region, the difference in conduction current among each type of regions in the oxide semiconductor layer can be reduced when the oxygen content and the thickness of the multiple types of regions are in a positive correlation. Consequently, the non-uniformity in the display brightness of a display panel caused by the target materials could be alleviated, and the display effect of the display panel could be improved.

Examples of the present disclosure provide an oxide semiconductor layer, which can be manufactured by the method (as shown in FIG. 2 or 3) for manufacturing an oxide semiconductor layer according to the examples of the present disclosure. Exemplarily, the oxide semiconductor layer has multiple types of regions, wherein at least two types of the multiple types of regions have different thicknesses, and an oxygen content and thickness in the multiple types of regions are positively correlated.

Examples of the present disclosure provide a display substrate, which includes the oxide semiconductor layer according to the examples of the present disclosure.

Examples of the present disclosure provide a display device, which includes the display substrate according to the examples of the present disclosure. The display device may be any product or component having a display function, such as a liquid crystal panel, a piece of electronic paper, an organic light emitting diode panel, a light emitting diode panel, a mobile phone, a tablet computer, a television, a display, a laptop computer, a digital photo frame, and a navigator, or the like.

Examples of the present disclosure provide a semiconductor means, which includes the oxide semiconductor layer according to the examples of the present disclosure. Exemplarily, the semiconductor means may be a thin film transistor, a chip or the like.

It should be noted that the examples with respect to the method and those with respect to the device for preparing the oxide semiconductor layer provided in the examples of the present disclosure can be mutually referred to, which is not limited in the examples of the present disclosure. The sequential order of the steps in the method examples provided in the examples of the present disclosure can be adjusted properly, and the step(s) may also be added or deleted accordingly as required. Any variations to the method readily conceivable to any person skilled in the art within the technical scope disclosed by the present disclosure shall fall within the protection scope of the present disclosure. Therefore, detailed descriptions are not repeated herein.

Other examples of the present disclosure will be apparent to those skilled in the art from consideration of the specification and practice of the present disclosure. The present disclosure is intended to encompass any variations, uses, or modifications of the present disclosure following the general principles thereof and including common knowledge or commonly used technical means which are not disclosed herein. The specification and examples are to be regarded as exemplary only, with a true scope and spirit of the present disclosure indicated by the following claims.

It will be appreciated that the present disclosure shall not be limited to the exact construction that has been described above and illustrated in the accompanying drawings, and that various modifications and changes can be made without departing from the scope thereof. It is intended that the scope of the present disclosure only be limited in the appended claims.

What is claimed is:

1. A method for preparing an oxide semiconductor layer, comprising:

forming an oxide semiconductor layer having multiple types of regions on a substrate, at least two types of the multiple types of regions having different thicknesses; and adjusting an oxygen content of at least one type of regions in the multiple types of regions, so that the oxygen content and the thickness in the multiple types of regions are positively correlated, wherein the at least one type of regions in the multiple types of regions comprises: a first type of regions having a thickness of 1090 angstroms, and a second type of regions having a thickness of 1063 angstroms;

wherein the adjusting an oxygen content of at least one type of regions in the multiple types of regions comprises:

providing oxygen to a side of the substrate, on which the oxide semiconductor layer is located; and irradiating the at least one type of regions with ultraviolet rays to dissociate oxygen as oxygen ions, which then enter the at least one type of regions, wherein the ultraviolet rays irradiating the first type of regions have a wavelength of 30 nm, and the ultraviolet rays irradiating the second type of regions have a wavelength of 100 nm, wherein energy of the ultraviolet rays for irradiating the at least one type of regions and the thickness of the at least one type of regions are positively correlated.

2. The method according to claim 1, wherein the at least one type of regions comprises each region of the oxide semiconductor layer.

3. The method according to claim 1, wherein the at least one type of regions comprises parts of the multiple types of regions.

4. The method according to claim 1, wherein the forming an oxide semiconductor layer having multiple types of regions on a substrate comprises:

forming the oxide semiconductor layer on the substrate by a magnetron sputtering method.

5. The method according to claim 1, further comprising: annealing the oxide semiconductor layer when adjusting the oxygen content of the at least one type of regions in the multiple types of regions.

6. The method according to claim 5, wherein the annealing the oxide semiconductor layer comprises: annealing the oxide semiconductor layer by using an annealing furnace; and prior to the annealing the oxide semiconductor layer by using an annealing furnace, the method further comprises: vacuumizing the annealing furnace.

7. The method according to claim 1, further comprising: annealing the oxide semiconductor layer when adjusting the oxygen content of the at least one type of regions in the multiple types of regions.

8. The method according to claim 1, comprising:

reducing a difference in conduction current among the multiple types of regions having different thicknesses in the oxide semiconductor layer, such that the conduction current of the multiple types of regions and the oxygen content of the multiple types of regions are negatively correlated.

9. The method according to claim 1, comprising:

reducing a difference in conduction current among the multiple types of regions having different thicknesses in the oxide semiconductor layer, such that the conduction current of the multiple types of regions and the oxygen content of the multiple types of regions are negatively correlated; and annealing the oxide semiconductor layer when adjusting the oxygen content of the at least one type of regions in the multiple types of regions.

10. A device for implementing the method of claim 1 to prepare an oxide semiconductor layer, the device comprising:

a coating apparatus for forming an oxide semiconductor layer having multiple types of regions on a substrate, at least two types of the multiple types of regions having different thicknesses; and an oxygen content adjusting apparatus for adjusting an oxygen content of at least one type of regions in the multiple types of regions, so that the oxygen content and the thickness in the multiple types of regions are positively correlated, wherein the oxygen content adjusting apparatus comprises: an oxygen introducing pump and an ultraviolet lamp assembly;

the oxygen introducing pump is configured to provide oxygen to a side of the substrate, on which the oxide semiconductor layer is located;

the ultraviolet lamp assembly is configured to irradiate the at least one type of regions with ultraviolet rays to dissociate the oxygen as oxygen ions, which then enter the at least one type of regions; and wherein energy of the ultraviolet rays emitted from the ultraviolet lamp assembly to the at least one type of regions and the thickness of the at least one type of regions are positively correlated.

11. The device according to claim 10, further comprising: an annealing furnace configured to anneal the oxide semiconductor layer, wherein the oxygen content adjusting apparatus is configured to adjust the oxygen content of the at least one type of regions in the multiple types of regions within the annealing furnace.

12. The device according to claim 11, further comprising: a vacuum generating apparatus configured to vacuumize the annealing furnace.

13. An oxide semiconductor layer prepared by the method of claim 1, wherein the oxide semiconductor layer has multiple types of regions, at least two types of the multiple types of regions have different thicknesses, and oxygen content and thickness in the multiple types of regions are positively correlated.

14. A semiconductor means, comprising the oxide semiconductor layer of claim 13.

15. A display substrate, comprising the oxide semiconductor layer of claim 13.

16. A display device, comprising the display substrate of claim 15.

* * * * *